United States Patent
Canepa et al.

(10) Patent No.: US 9,905,294 B1
(45) Date of Patent: Feb. 27, 2018

(54) WRITING LOGICALLY OFFSET PAGES OF DATA TO N-LEVEL MEMORY CELLS COUPLED TO A COMMON WORD LINE

(71) Applicant: Seagate Technology, LLC, Cupertino, CA (US)

(72) Inventors: Timothy L. Canepa, Los Gatos, CA (US); Alex Tang, Cupertino, CA (US); Stephen Hanna, Fort Collins, CO (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/585,429

(22) Filed: May 3, 2017

(51) Int. Cl.
*G11C 16/04* (2006.01)
*G11C 11/56* (2006.01)
*G11C 13/00* (2006.01)
*G06F 12/02* (2006.01)
*G11C 16/24* (2006.01)
*G11C 16/26* (2006.01)
*G06F 13/40* (2006.01)

(52) U.S. Cl.
CPC ...... *G11C 11/5642* (2013.01); *G06F 12/0246* (2013.01); *G06F 13/4004* (2013.01); *G11C 11/5628* (2013.01); *G11C 13/004* (2013.01); *G11C 13/0069* (2013.01); *G11C 16/0483* (2013.01); *G11C 16/24* (2013.01); *G11C 16/26* (2013.01)

(58) Field of Classification Search
CPC ............ G11C 11/5642; G11C 16/0483; G11C 11/5628; G11C 16/26; G11C 13/004; G11C 13/0069; G11C 16/24; G06F 13/4004; G06F 12/0246

USPC ........................................ 365/185.03, 185.16
See application file for complete search history.

(56) References Cited

U.S. PATENT DOCUMENTS

| | | |
|---|---|---|
| 6,938,116 B2 | 8/2005 | Kim et al. |
| 7,549,021 B2 | 6/2009 | Warren, Jr. |
| 7,984,259 B1 | 7/2011 | English |
| 8,180,954 B2 | 5/2012 | Kilzer et al. |
| 8,301,836 B2 | 10/2012 | Ledford |
| 8,385,120 B2 | 2/2013 | Jang et al. |
| 8,639,871 B2 | 1/2014 | Borchers et al. |
| 8,700,842 B2 | 4/2014 | Dinker |
| 8,724,389 B2 | 5/2014 | In |
| 8,982,627 B2 | 3/2015 | MacCarrone et al. |
| 9,201,790 B2 | 12/2015 | Keeler et al. |

(Continued)

*Primary Examiner* — David Lam
(74) *Attorney, Agent, or Firm* — Hall Estill Attorneys at Law

(57) ABSTRACT

Method and apparatus for managing data in a data storage device. In some embodiments, a non-volatile cache memory stores a sequence of pages from a host device. A non-volatile main memory has a plurality of n-level cells arranged on m separate integrated circuit dies each simultaneously accessible during programming and read operations using an associated transfer circuit, where m and n are plural numbers. A control circuit writes first and second pages from the sequence of pages to a selected set of the n-level cells coupled to a common word line on a selected integrated circuit die. The second page is separated from the first page in the sequence of pages by a logical offset comprising a plurality of intervening pages in the sequence of pages. The logical offset is selected responsive to the m number of integrated circuit dies and a delay time associated with the transfer circuits.

20 Claims, 10 Drawing Sheets

(56) References Cited

U.S. PATENT DOCUMENTS

| | | |
|---|---|---|
| 9,323,659 B2 | 4/2016 | Shats et al. |
| 2004/0210794 A1 | 10/2004 | Frey et al. |
| 2016/0077928 A1 | 3/2016 | Dwivedi et al. |
| 2016/0125947 A1* | 5/2016 | Yano .................. G11C 16/16 365/185.12 |

* cited by examiner

SLC CACHE                                                              ← 200

| HPA | HPA | HPA | HPA | HPA | HPA |
|-----|-----|-----|-----|-----|-----|
| 0   | 100 | 200 | 300 | 400 | 500 |
| 10  | 110 | 210 | 310 | 410 | 510 |
| 20  | 120 | 220 | 320 | 420 | 520 |
| 30  | 130 | 230 | 330 | 430 | 530 |
| 40  | 140 | 240 | 340 | 440 | 540 |
| 50  | 150 | 250 | 350 | 450 | 550 |
| 60  | 160 | 260 | 360 | 460 | 560 |
| 70  | 170 | 270 | 370 | 470 | 570 |
| 80  | 180 | 280 | 380 | 480 | 580 |
| 90  | 190 | 290 | 390 | 490 | 590 |
| A0  | 1A0 | 2A0 | 3A0 | 4A0 | 5A0 |
| B0  | 1B0 | 2B0 | 3B0 | 4B0 | 5B0 |
| C0  | 1C0 | 2C0 | 3C0 | 4C0 | 5C0 |
| D0  | 1D0 | 2D0 | 3D0 | 4D0 | 5D0 |
| E0  | 1E0 | 2E0 | 3E0 | 4E0 | 5E0 |
| F0  | 1F0 | 2F0 | 3F0 | 4F0 | 5F0 |

FIG. 9A

TLC FLASH (MAIN MEMORY)                                                ← 200

| DIE | WORD LINE 0 | | | WORD LINE 1 | | |
|-----|---|---|---|---|---|---|
| 0 | E | E | E | E | E | E |
| 1 | E | E | E | E | E | E |
| 2 | E | E | E | E | E | E |
| 3 | E | E | E | E | E | E |
| 4 | E | E | E | E | E | E |
| 5 | E | E | E | E | E | E |
| 6 | E | E | E | E | E | E |
| 7 | E | E | E | E | E | E |
| 8 | E | E | E | E | E | E |
| 9 | E | E | E | E | E | E |
| A | E | E | E | E | E | E |
| B | E | E | E | E | E | E |
| C | E | E | E | E | E | E |
| D | E | E | E | E | E | E |
| E | E | E | E | E | E | E |
| F | E | E | E | E | E | E |

FIG. 9B

SLC PROGRAMMING

| HPA |
|---|
| 0 |
| 10 |
| 20 |
| 30 |
| 40 |
| 50 |
| 60 |
| 70 |
| 80 |
| 90 |
| A0 |
| B0 |
| C0 |
| D0 |
| E0 |
| F0 |

| HPA |
|---|
| 100 |
| 110 |
| 120 |
| 130 |
| 140 |
| 150 |
| 160 |
| 170 |
| 180 |
| 190 |
| 1A0 |
| 1B0 |
| 1C0 |
| 1D0 |
| 1E0 |
| 1F0 |

| HPA |
|---|
| 200 |
| 210 |
| 220 |
| 230 |
| 240 |
| 250 |
| 260 |
| 270 |
| 280 |
| 290 |
| 2A0 |
| 2B0 |
| 2C0 |
| 2D0 |
| 2E0 |
| 2F0 |

| HPA |
|---|
| 300 |
| 310 |
| 320 |
| 330 |
| 340 |
| 350 |
| 360 |
| 370 |
| 380 |
| 390 |
| 3A0 |
| 3B0 |
| 3C0 |
| 3D0 |
| 3E0 |
| 3F0 |

| HPA |
|---|
| 400 |
| 410 |
| 420 |
| 430 |
| 440 |
| 450 |
| 460 |
| 470 |
| 480 |
| 490 |
| 4A0 |
| 4B0 |
| 4C0 |
| 4D0 |
| 4E0 |
| 4F0 |

| HPA |
|---|
| 500 |
| 510 |
| 520 |
| 530 |
| 540 |
| 550 |
| 560 |
| 570 |
| 580 |
| 590 |
| 5A0 |
| 5B0 |
| 5C0 |
| 5D0 |
| 5E0 |
| 5F0 |

| DIE |
|---|
| 0 |
| 1 |
| 2 |
| 3 |
| 4 |
| 5 |
| 6 |
| 7 |
| 8 |
| 9 |
| A |
| B |
| C |
| D |
| E |
| F |

| HPA | | |
|---|---|---|
| 0 | E | E |
| 10 | E | E |
| 20 | E | E |
| 30 | E | E |
| C0 | E | E |
| D0 | E | E |
| E0 | E | E |
| F0 | E | E |
| 180 | E | E |
| 190 | E | E |
| 1A0 | E | E |
| 1B0 | E | E |
| 240 | E | E |
| 250 | E | E |
| 260 | E | E |
| 270 | E | E |

| HPA | | |
|---|---|---|
| 300 | E | E |
| 310 | E | E |
| 320 | E | E |
| 330 | E | E |
| 3C0 | E | E |
| 3D0 | E | E |
| 3E0 | E | E |
| 3F0 | E | E |
| 480 | E | E |
| 490 | E | E |
| 4A0 | E | E |
| 4B0 | E | E |
| 540 | E | E |
| 550 | E | E |
| 560 | E | E |
| 570 | E | E |

FIG. 10A

MLC PROGRAMMING

| HPA | HPA | HPA | HPA | HPA | HPA |
|---|---|---|---|---|---|
| 0 | 100 | 200 | 300 | 400 | 500 |
| 10 | 110 | 210 | 310 | 410 | 510 |
| 20 | 120 | 220 | 320 | 420 | 520 |
| 30 | 130 | 230 | 330 | 430 | 530 |
| 40 | 140 | 240 | 340 | 440 | 540 |
| 50 | 150 | 250 | 350 | 450 | 550 |
| 60 | 160 | 260 | 360 | 460 | 560 |
| 70 | 170 | 270 | 370 | 470 | 570 |
| 80 | 180 | 280 | 380 | 480 | 580 |
| 90 | 190 | 290 | 390 | 490 | 590 |
| A0 | 1A0 | 2A0 | 3A0 | 4A0 | 5A0 |
| B0 | 1B0 | 2B0 | 3B0 | 4B0 | 5B0 |
| C0 | 1C0 | 2C0 | 3C0 | 4C0 | 5C0 |
| D0 | 1D0 | 2D0 | 3D0 | 4D0 | 5D0 |
| E0 | 1E0 | 2E0 | 3E0 | 4E0 | 5E0 |
| F0 | 1F0 | 2F0 | 3F0 | 4F0 | 5F0 |

| DIE |
|---|
| 0 |
| 1 |
| 2 |
| 3 |
| 4 |
| 5 |
| 6 |
| 7 |
| 8 |
| 9 |
| A |
| B |
| C |
| D |
| E |
| F |

| HPA | HPA | |
|---|---|---|
| 0 | 40 | E |
| 10 | 50 | E |
| 20 | 60 | E |
| 30 | 70 | E |
| C0 | 100 | E |
| D0 | 110 | E |
| E0 | 120 | E |
| F0 | 130 | E |
| 180 | 1C0 | E |
| 190 | 1D0 | E |
| 1A0 | 1E0 | E |
| 1B0 | 1F0 | E |
| 240 | 280 | E |
| 250 | 290 | E |
| 260 | 2A0 | E |
| 270 | 2B0 | E |

| HPA | HPA | |
|---|---|---|
| 300 | 340 | E |
| 310 | 350 | E |
| 320 | 360 | E |
| 330 | 370 | E |
| 3C0 | 400 | E |
| 3D0 | 410 | E |
| 3E0 | 420 | E |
| 3F0 | 430 | E |
| 480 | 4C0 | E |
| 490 | 4D0 | E |
| 4A0 | 4E0 | E |
| 4B0 | 4F0 | E |
| 540 | 580 | E |
| 550 | 590 | E |
| 560 | 5A0 | E |
| 570 | 5B0 | E |

FIG. 10B

TLC PROGRAMMING

| HPA |
|---|
| 0 |
| 10 |
| 20 |
| 30 |
| 40 |
| 50 |
| 60 |
| 70 |
| 80 |
| 90 |
| A0 |
| B0 |
| C0 |
| D0 |
| E0 |
| F0 |

| HPA |
|---|
| 100 |
| 110 |
| 120 |
| 130 |
| 140 |
| 150 |
| 160 |
| 170 |
| 180 |
| 190 |
| 1A0 |
| 1B0 |
| 1C0 |
| 1D0 |
| 1E0 |
| 1F0 |

| HPA |
|---|
| 200 |
| 210 |
| 220 |
| 230 |
| 240 |
| 250 |
| 260 |
| 270 |
| 280 |
| 290 |
| 2A0 |
| 2B0 |
| 2C0 |
| 2D0 |
| 2E0 |
| 2F0 |

| HPA |
|---|
| 300 |
| 310 |
| 320 |
| 330 |
| 340 |
| 350 |
| 360 |
| 370 |
| 380 |
| 390 |
| 3A0 |
| 3B0 |
| 3C0 |
| 3D0 |
| 3E0 |
| 3F0 |

| HPA |
|---|
| 400 |
| 410 |
| 420 |
| 430 |
| 440 |
| 450 |
| 460 |
| 470 |
| 480 |
| 490 |
| 4A0 |
| 4B0 |
| 4C0 |
| 4D0 |
| 4E0 |
| 4F0 |

| HPA |
|---|
| 500 |
| 510 |
| 520 |
| 530 |
| 540 |
| 550 |
| 560 |
| 570 |
| 580 |
| 590 |
| 5A0 |
| 5B0 |
| 5C0 |
| 5D0 |
| 5E0 |
| 5F0 |

| DIE |
|---|
| 0 |
| 1 |
| 2 |
| 3 |
| 4 |
| 5 |
| 6 |
| 7 |
| 8 |
| 9 |
| A |
| B |
| C |
| D |
| E |
| F |

| HPA | HPA | HPA |
|---|---|---|
| 0 | 40 | 80 |
| 10 | 50 | 90 |
| 20 | 60 | A0 |
| 30 | 70 | B0 |
| C0 | 100 | 140 |
| D0 | 110 | 150 |
| E0 | 120 | 160 |
| F0 | 130 | 170 |
| 180 | 1C0 | 200 |
| 190 | 1D0 | 210 |
| 1A0 | 1E0 | 220 |
| 1B0 | 1F0 | 230 |
| 240 | 280 | 2C0 |
| 250 | 290 | 2D0 |
| 260 | 2A0 | 2E0 |
| 270 | 2B0 | 2F0 |

| HPA | HPA | HPA |
|---|---|---|
| 300 | 340 | 380 |
| 310 | 350 | 390 |
| 320 | 360 | 3A0 |
| 330 | 370 | 3B0 |
| 3C0 | 400 | 440 |
| 3D0 | 410 | 450 |
| 3E0 | 420 | 460 |
| 3F0 | 430 | 470 |
| 480 | 4C0 | 500 |
| 490 | 4D0 | 510 |
| 4A0 | 4E0 | 520 |
| 4B0 | 4F0 | 530 |
| 540 | 580 | 5C0 |
| 550 | 590 | 5D0 |
| 560 | 5A0 | 5E0 |
| 570 | 5B0 | 5F0 |

FIG. 10C

GARBAGE COLLECTION PROCESSING (TLC to TLC)

| DIE | HPA | HPA | HPA | | HPA | HPA | HPA |
|---|---|---|---|---|---|---|---|
| 0 | 0 | 40 | 80 | | 300 | 340 | 380 |
| 1 | 10 | 50 | 90 | | 310 | 350 | 390 |
| 2 | 20 | 60 | A0 | | 320 | 360 | 3A0 |
| 3 | 30 | 70 | B0 | | 330 | 370 | 3B0 |
| 4 | C0 | 100 | 140 | | 3C0 | 400 | 440 |
| 5 | D0 | 110 | 150 | | 3D0 | 410 | 450 |
| 6 | E0 | 120 | 160 | | 3E0 | 420 | 460 |
| 7 | F0 | 130 | 170 | | 3F0 | 430 | 470 |
| 8 | 180 | 1C0 | 200 | | 480 | 4C0 | 500 |
| 9 | 190 | 1D0 | 210 | | 490 | 4D0 | 510 |
| A | 1A0 | 1E0 | 220 | | 4A0 | 4E0 | 520 |
| B | 1B0 | 1F0 | 230 | | 4B0 | 4F0 | 530 |
| C | 240 | 280 | 2C0 | | 540 | 580 | 5C0 |
| D | 250 | 290 | 2D0 | | 550 | 590 | 5D0 |
| E | 260 | 2A0 | 2E0 | | 560 | 5A0 | 5E0 |
| F | 270 | 2B0 | 2F0 | | 570 | 5B0 | 5F0 |

↓ ↓

| DIE | HPA | HPA | HPA | | HPA | HPA | HPA |
|---|---|---|---|---|---|---|---|
| 0 | 0 | 40 | 80 | | 300 | 400 | 500 |
| 1 | 10 | 50 | 90 | | 310 | 410 | 510 |
| 2 | 20 | 60 | A0 | | 320 | 420 | 520 |
| 3 | 30 | 70 | B0 | | 330 | 430 | 530 |
| 4 | C0 | 100 | 140 | | 3C0 | 4C0 | 5C0 |
| 5 | D0 | 110 | 150 | | 3D0 | 4D0 | 5D0 |
| 6 | E0 | 120 | 160 | | 3E0 | 4E0 | 5E0 |
| 7 | F0 | 130 | 170 | | 3F0 | 4F0 | 5F0 |
| 8 | 180 | 1C0 | 200 | | 480 | 580 | 380 |
| 9 | 190 | 1D0 | 210 | | 490 | 590 | 390 |
| A | 1A0 | 1E0 | 220 | | 4A0 | 5A0 | 3A0 |
| B | 1B0 | 1F0 | 230 | | 4B0 | 5B0 | 3B0 |
| C | 240 | 280 | 2C0 | | 540 | 340 | 440 |
| D | 250 | 290 | 2D0 | | 550 | 350 | 450 |
| E | 260 | 2A0 | 2E0 | | 560 | 360 | 460 |
| F | 270 | 2B0 | 2F0 | | 570 | 370 | 470 |

WRITING LOGICALLY OFFSET PAGES OF DATA TO N-LEVEL MEMORY CELLS COUPLED TO A COMMON WORD LINE

SUMMARY

Various embodiments disclosed herein are generally directed to the management of data in a data storage device, such as a solid state drive (SSD) that uses n-level NAND flash memory cells.

In accordance with some embodiments, a non-volatile cache memory stores a sequence of pages from a host device. A non-volatile main memory has a plurality of n-level cells arranged on m separate integrated circuit dies each simultaneously accessible during programming and read operations using an associated transfer circuit, where m and n are plural numbers. A control circuit writes first and second pages from the sequence of pages to a selected set of the n-level cells coupled to a common word line on a selected integrated circuit die. The second page is separated from the first page in the sequence of pages by a logical offset comprising a plurality of intervening pages in the sequence of pages. The logical offset is selected responsive to the m number of integrated circuit dies and a delay time associated with the transfer circuits.

These and other features and advantages which may characterize various embodiments can be understood in view of the following detailed discussion and the accompanying drawings.

BRIEF DESCRIPTION OF THE DRAWINGS

FIG. 9A illustrates exemplary accumulated data in the cache memory.

FIG. 9B illustrates memory locations available in the n-level flash array to accommodate the data from FIG. 8.

FIGS. 10A, 10B and 10C successively show a transfer of the data from the cache memory to the n-level flash array along sub-R block boundaries in some embodiments.

FIG. 11 illustrates a garbage collection operation to rearrange data in the N-level flash array.

DETAILED DESCRIPTION

Figure 1:
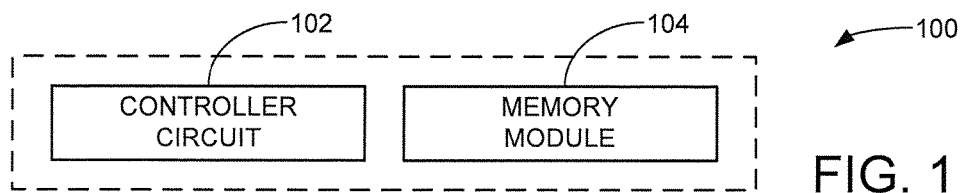
FIG. 1 provides a functional block representation of an exemplary data storage device in accordance with some embodiments.

The present disclosure generally relates to the management of data in a solid state drive (SSD) data storage device having a NAND flash array with multiple bit flash memory cells (e.g., n-level flash memory cells where n is greater than 1).

Data storage devices are provided with one or more memory devices to store and/or retrieve computerized data. Some solid-state semiconductor based memory devices, such as flash memory, utilize the transfer of charge to establish programming states in individual memory cells.

Flash memory stores data in the form of accumulated charge on floating gates of flash memory cells. The memory cells may be characterized as nMOSFETs (n-channel metal oxide semiconductor field effect transistors) with a floating gate structure that is electrically isolated from a main control gate of each transistor. The memory cells store substantially no accumulated charge on the floating gates in an erased state, and store increased amounts of accumulated charge when programmed. Programming operations cause migration of charge from the main channel to the floating gates, and erasure operations migrate charge from the floating gates to reset the cells to a base (erased) state.

Efforts continue to be made in the industry to increase the storage capacity of semiconductor memories such as NAND flash devices. Memory cells configured as single level cells (SLCs) each store a single bit per cell, and tend to provide both faster data transfer rates and enhanced operational life. Data storage densities can be increased by programming the cells to store more than a single bit. Multi-level cells (MLCs) store two bits, triple-level cells (TLCs) store three bits, 4× level cells (XLCs) store four bits, and so on. Generally, a cell can be programmed to N total bits using $2^N$ different charge levels (e.g., storing two bits requires four levels, storing three bits requires eight levels, etc.). Storing multiple bits per cell tends to decrease data transfer rates and increases wear on the cells, leading to a shorter operational life.

Input user data to be written to a flash memory are usually arranged into groupings of data referred to as pages. Each page of data has a selected total number of bits depending upon a number of factors including the physical construction of the memory. Example page lengths may be 4 KB (4096 bytes), 8 KB, 16 KB, 32 KB, etc. It is common to arrange a NAND flash memory with a number of the flash memory cells connected to a common gate control line (word line). Each page of data is stored to the memory cells connected to the same word line, with a single bit of the page stored to a different cell along the word line. Memory cells that store multiple bits are often arranged to initially store a first page of data as SLCs. A second page of data written to the same cells transitions the cells to MLCs, a third page written to the same cells transitions the cells to TLCs, etc.

While operable to enhance the data storage capacity of a given device, programming a group of multiple bit flash memory cells (e.g., n-level cells where n is greater than 1) provides a number of challenges. Directly programming an n-level flash cell word line with sequential data sectors from a host (e.g., logical block addresses, or LBAs) would tend to degrade sequential read performance of the memory during a subsequent read operation. This is because all of the adjacent data within a given logical range would be stored on the same semiconductor die and use the same readback circuitry (lane or channel) to recover the data. For example, in a case where 32 KB pages were stored in a set of TLCs with the lower, middle and upper pages stored sequential LBAs, 96 KB or more of data would be stored on a single set of memory cells on the same word line. This could ultimately limit the rate at which streaming LBAs could be recovered from the memory.

Accordingly, various embodiments of the present disclosure are directed to a method and apparatus for managing the storage of data in a memory having n-level memory cells, such as but not limited to NAND flash memory. As explained below, in some embodiments a non-volatile cache memory, such as an SLC flash cache, is configured to store a plurality of sequentially received pages of data from a host device.

A non-volatile main memory is configured to receive a transfer of the cached pages from the cache memory. The non-volatile main memory is configured to include a plurality of n-level cells arranged on m separate integrated circuit dies each simultaneously accessible during programming and read operations using an associated transfer circuit, where both m and n are plural numbers.

A control circuit, such as an SSD controller, is configured to direct the simultaneous writing of selected groups of non-adjacent pages from the cache to the n-level cells coupled to a common word line. A logical offset between a first page and a second page written to the word line is selected responsive to the m number of dies and a delay time associated with the transfer circuits. In this way, substantially any set of the pages stored to the main memory can be recovered during a read operation at a maximum average data transfer rate.

NAND flash memory arrays that utilize TLC recording are exemplified in the following discussion. This is merely for purposes of illustration and is not limiting, as any number of arrangements can be used including but not limited to MLCs, XLCs, etc.; two dimensional (2D) flash arrays; three dimensional (3D) flash arrays; other forms of solid-state semiconductor non-volatile memory such as RRAM, MRAM, STRAM, PLCs, etc.; non-solid state memories adapted to store multiple bits per "cell" such as three dimensional magnetic recording (3DMR) discs that employs multiple stacked recording layers, etc.

These and other features and aspects of various embodiments will be understood beginning with a review of FIG. 1 which generally illustrates an exemplary data storage device 100. The device 100 includes a controller 102 and a memory module 104. The controller 102 provides top level control for the device 100 and may be configured as a programmable processor with associated programming in local memory. Additionally or alternatively, the controller may take the form of a hardware based control circuit with logic gates or other elements to carry out the required controller functions.

The memory module 104 can be arranged as one or more non-volatile memory elements including rotatable recording discs and solid-state memory arrays. While a separate controller 102 is shown in FIG. 1, such is unnecessary as alternative embodiments may incorporate any requisite controller functions directly into the memory module. While not limiting, for purposes of the present discussion it will be contemplated that the data storage device 100 is a solid-state drive (SSD) that utilizes a three dimensional (3D) NAND flash memory array that makes up at least some of the memory capacity of the memory module to provide a main data store for a host device (not shown). Other forms of memory can be used.

Figure 2:
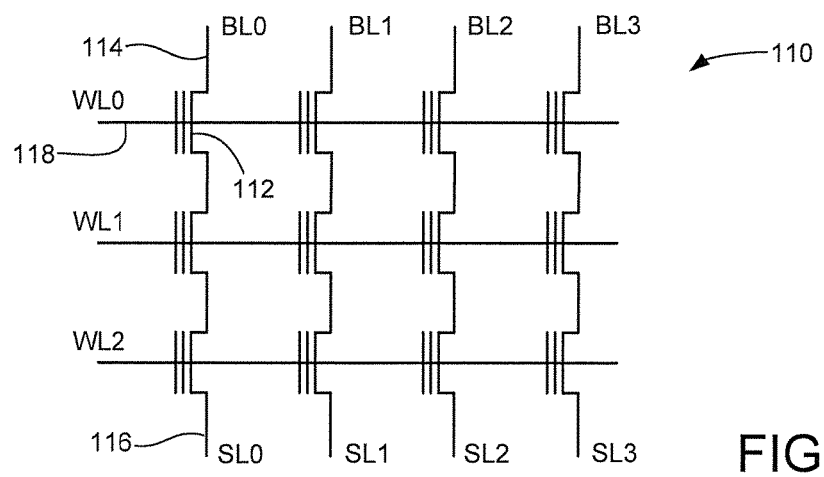
FIG. 2 is a schematic depiction of a portion of a NAND flash memory array of the device of FIG. 1.

FIG. 2 provides a schematic depiction of a portion of a flash memory array 110 of the memory module 104 of FIG. 1 in accordance with some embodiments. Other configurations can be used so that FIG. 2 is merely exemplary and not limiting. The arrangement in FIG. 2 is a two dimensional (2D) layout similar to a conventional 2D NAND configuration. It is contemplated albeit not required that each column in FIG. 2 represents a vertical stack of elements within the 3D array.

Flash memory cells 112 are accessed by bit lines (BL0-BL3) 114, source lines (SL0-SL3) 116 and word lines (WL0-WL2) 118. Other selection circuitry and control lines are contemplated but not shown for clarity, such as selection transistors at the top and bottom of each column, etc. Programming, read and erase operations are carried out by asserting appropriate voltages to the respective bit, source and word lines 114, 116 and 118. One or more pages of data are stored to each row of cells, e.g., the cells 112 coupled to a given word line 112. It is contemplated for the purposes of the present example that each page is 32 KB, although other sizes can be used.

Figure 3:
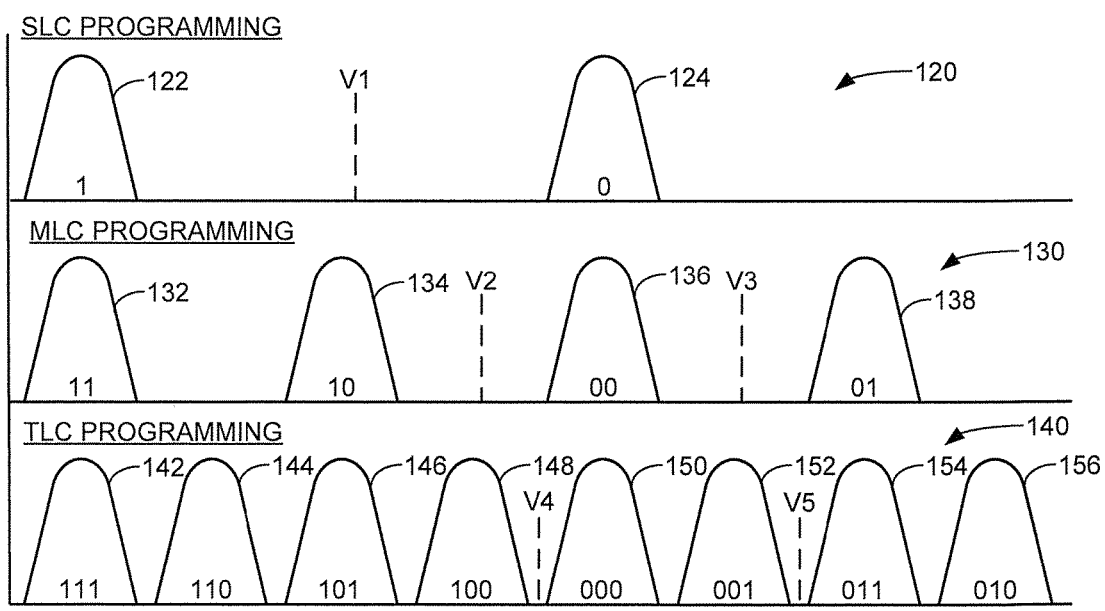
FIG. 3 shows accumulated charge distributions on the flash memory cells of FIG. 2 using different programming conventions in accordance with some embodiments.

FIG. 3 is a graphical representation of different programming formats for the flash memory cells 112 of FIG. 2. Single level cell (SLC) programming is represented at 120 and includes two respective populations of cells as shown by generalized population curves 122 and 124. The shapes and extents of the curves will tend to be substantially Gaussian, although other forms can arise based on a variety of factors. Curve 122 represents the flash memory cells in an erased or substantially erased state so that little or no electrical charge is accumulated on the floating gate structures of these cells. This corresponds to a logical state or value (programmed value) of logical 1. Curve 124 represents flash memory cells that have accumulated a selected quanta of accumulated charge sufficient to indicate a programmed state of logical 0. Other conventions can be used.

The accumulation of charge on the floating gate of a flash memory cell tends to raise the amount of voltage that needs to be applied to a control gate (affixed to the word line) to place the cell in a forward (source-drain) conductive state. Application of a suitable intermediary gate voltage V1 would enable readback circuitry of the device 100 to discern the programmed state of the cells. As will be appreciated, application of the voltage V1 would render the cells in population 122 in a conductive state, while the voltage V1 would not be sufficient to place the cells in population 124 in a conductive state.

FIG. 3 further shows multi-level cell (MLC) programming at 130, as respectively including two-bit logical values of 11, 10, 00 and 01 (populations 132, 134, 136 and 138). As common in the art, the SLCs 120 are subsequently programmed with additional accumulated charge as required to split the two SLC distributions into four MLC distributions. If the SLCs are programmed using a first page of data, then a second page of data is programmed on top of the first page as shown, with the most significant bit (MSB) for each cell representing the corresponding bit in the first page and the least significant bit (LSB) for each cell representing the corresponding bit in the second page. As before, suitable intermediary voltages such as (but not limited to) voltages V2 and V3 can be successively applied to discern the final programmed state of a given cell.

Triple-level cell (TLC) programming, also sometimes referred to as three-level cell programming, is denoted at 140. This involves eight three-bit states 111, 110, 101, 100, 000, 001, 011 and 010 as provided by corresponding populations 142, 144, 146, 148, 150, 152, 154 and 156. Various intermediate voltages including, but not limited to, voltages V4 and V5 may be successively applied to discern the programmed state of the various cells.

TLCs can be formed by programming a third page of data onto a set of MLCs. In the case of TLCs, the MSB represents the first page, the intermediate significant bit (ISB) represents the second page and the LSB represents the third page. Other formats can be used in accordance with the present embodiments, including 4× level cells (XLCs), also four-level cells (FLCs), etc. Generally, from this it can be seen that a total number of N bits can be stored in a given cell using $2^n$ different accumulated charge states.

A main advantage of Solid State Drives (SSDs) is the ability to queue commands to multiple devices to greatly increase the overall bandwidth of any single flash device. This is particularly true for high-speed sequential reads where the very high bandwidth of the Host Interface can aggregate many individual and comparatively slow flash data reads into a single monolithic transfer with only an initial latency penalty. With the advent of "one shot" programming of multi-level flash devices the controller has the onus of insuring that the pages of data programmed to an array of dies in an SSD are formatted in such a way that any sequential read request naturally invokes multiple flash lanes and dies to complete the transfer. The example in FIG. 3 illustrates a performance loss that will occur if the controller simply writes sequential data to a given word line in a one shot flash device.

Figure 4:
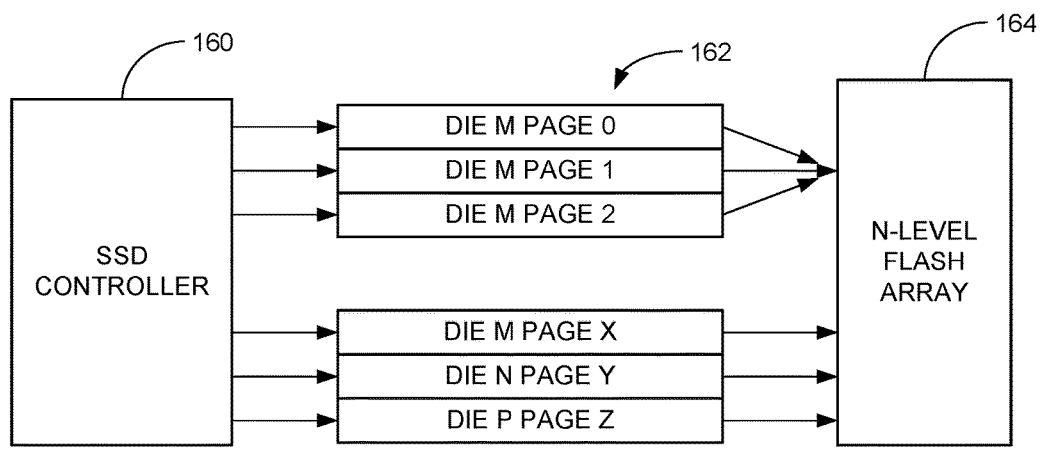
FIG. 4 shows a problem case and an ideal case of data transfers carried out in accordance with some embodiments.

FIG. 4 shows an SSD controller 160 (corresponding to the controller 102 in FIG. 1) that provides top level control of the writing of different pages of data 162 to an n-level flash array 164. In a first case ("problem case"), pages 0-2 are written to the same die M in the flash array 164, such as but not limited to the same word line.

In the problem case, the data are written sequentially as received from the host device to a single flash device over a single flash bus. When the host device attempts to read this same data the transfer will be slow since each page has to be accessed and the data transferred to the Host in a serial manner. For example, if each page 162 is 32 KB in length, the transfer rate Tr is 50 μs (e.g., the specified flash array read delay time to service a read command), the flash bus has a transfer rate of 400 MT/s (maximum rate at which data can be read from the array 164) and the host interface transfer rate is 1 GB/s, then the worst case bandwidth BW (throughput rate) to read the problem case data (pages 0-2) can be determined as:

$$BW = 3*32 \text{ KB}/((3*(50+32 \text{ KB}/500 \text{ MT/s})+32 \text{ KB}/1000 \text{ MB/s}) = 225 \text{ MB/s} \quad (1)$$

FIG. 4 further shows a second case ("ideal case") in which three pages X, Y and Z are written to different dies of the array 164, so that different read/write circuitry can access each of the separate die locations. As before, the data may be written sequentially as received from the host device, but this time to multiple dies across multiple lanes.

During a subsequent read operation the readback performance will be improved. As before, if each page is 32 KB, Tr is 50 μs, the flash bus transfer rate is 400 MT/s, and the host interface transfer rate is 1 GB/s, then the worst case bandwidth BW to read the ideal case data (pages X-Z) can be determined as:

$$BW = 3*32 \text{ KB}/((50+32 \text{ KB}/500 \text{ MT/s})+3*(32 \text{ KB}/1000 \text{ MB/s}) = 385 \text{ MB/s} \quad (2)$$

which represents about a 70% increase in transfer rate over the problem case.

The present disclosure operates to distribute input cached data in such a way as to achieve near-ideal data read back transfer rates for sequential data stored to an n-level array. As explained below, this is carried out by dividing the input cached data into data sets referred to as Sub-R Blocks. The Sub-R Blocks have page boundaries selected such that corresponding pages of data from multiple Sub-R Blocks are written to the same word line in the n-level array. The logical distance between different pages written to the same word line is sufficient to obtain essentially uniform read back rates for any selected subsets of the written data.

Figure 5:
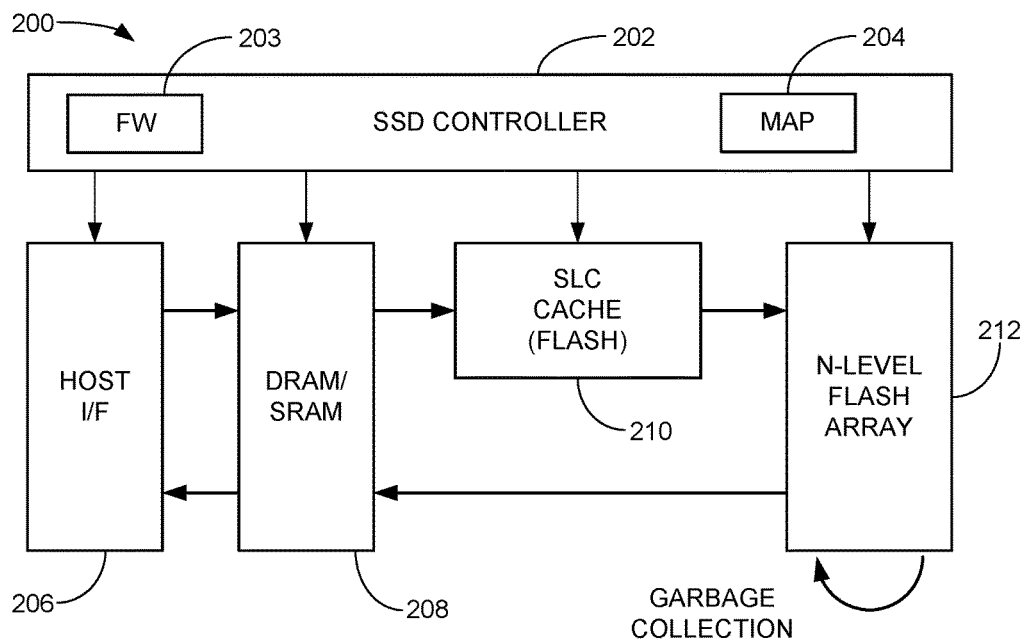
FIG. 5 is a functional block representation of the data storage device in accordance with some embodiments.

FIG. 5 is a functional block diagram for an SSD data storage device 200 generally corresponding to the device 100 in FIG. 1. The device 200 includes an SSD controller 202 that provides top level control for the device 200. As with the controller 100, the SSD controller 202 may be realized in a number of circuit configurations including a programmable processor that utilizes corresponding executable instructions (firmware, FW) in local memory 203. The SSD controller may alternatively be realized as a hardware circuit, etc. A map structure 204 stored in local memory is used by the SSD controller to track data in the system.

A host interface (I/F) 206 provides communication paths with an external host device. Local volatile buffer memory 208 may optionally be provided to temporarily buffer data during host transfer operations. The local memory 208 may be formed from one or more memory devices including DRAM, SRAM, etc.

An SLC cache memory 210 initially stores data received from the host. It is contemplated that the SLC cache memory 210 is formed from a set of non-volatile flash memory cells configured and operated as SLCs as described above. Other configurations may be used.

Data accumulated in the cache memory 210 are subsequently transferred, under the direction of the SSD controller 202, to an n-level flash array 212. It is contemplated for purposes of the present example that the NAND flash memory cells of the n-level flash array are configured as TLCs as described above, although such is not limiting.

As explained below, data are accumulated and tiled in the SLC cache memory 210 as a sequence of Sub-R Blocks at predefined boundaries. When the cache memory is full, a spillover operation is carried out in which the SSD controller 202 stages the Sub-R-Blocks with the required separation to insure the expected sequential read performance.

Once written, the data resident in the n-level flash array 212 may be rearranged to new locations using garbage collection techniques. Garbage collection techniques are similarly applied to the SLC cache memory 210 and new Sub-R Blocks are formed with newly received data from the host.

Figure 6:
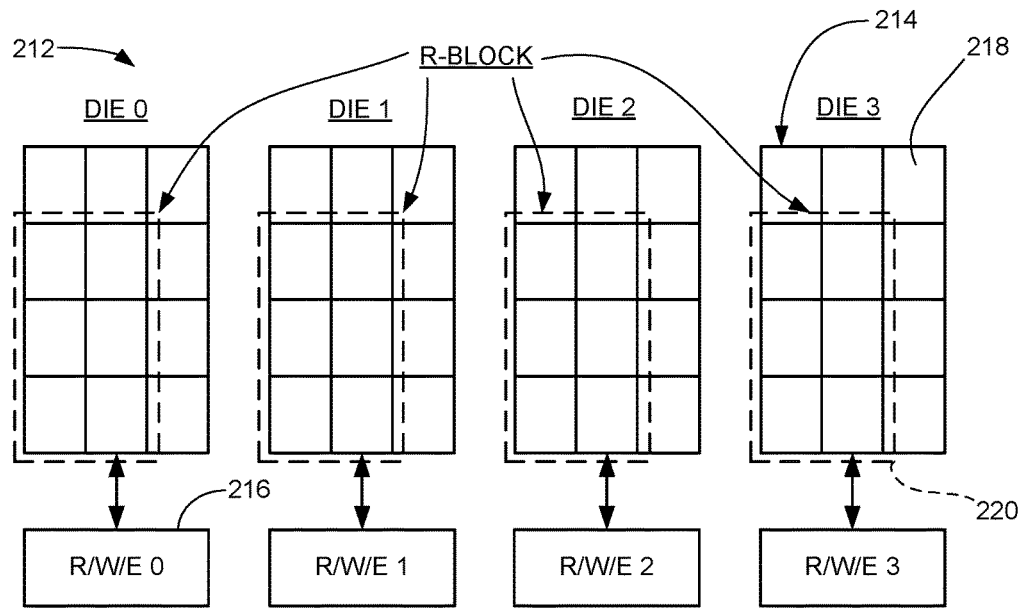
FIG. 6 shows aspects of the n-level flash array of FIG. 5.

FIG. 6 shows aspects of the n-level flash memory array 212 of FIG. 5 in accordance with some embodiments. The array 212 includes a plural number m of dies 214, each constituting a physically separate portion of the semiconductor integrated circuit(s) that make up the array 212. A total of four (4) dies 214 are shown (Die 0-3), although any plural number of dies can be utilized in a given array.

Each die 214 is accessed by a separate data access or transfer circuit 216 (also referred to as a read/write/erase, or R/W/E circuit). The separate dies 214 and circuits 216 allow data transfer operations (e.g., programming and reads) to be carried out simultaneously on common addresses.

Each die 214 is further shown to incorporate a number of erasure blocks 218. While each die is shown to only include a total of twelve such blocks 218, it will be understood that each die holds significantly many more erasure blocks. Each erasure block 218 represents the smallest amount of memory cells (e.g., 112, FIG. 2) that can be erased at a time. Pages of data are stored across different word lines (rows of memory cells) in each block 218.

Finally, an R-Block 220 is depicted in FIG. 6 as a grouping of selected ones of the erasure blocks 218 across the respective die 214. Generally, an R-Block can be viewed as a RAISE-Block (redundant array of independent silicon elements) or a garbage collection unit (GCU), which is separately allocated and erased as a unit. Each R-Block 220 generally has all of the blocks 218 across the entire array of dies at a specific R-Block address. An R-Block address is the integer result of the following expression:

$$R\text{-Block Address}=\text{Int}(\text{Flash Block Address}/\text{Flash Plane Size}) \qquad (3)$$

Figure 7:
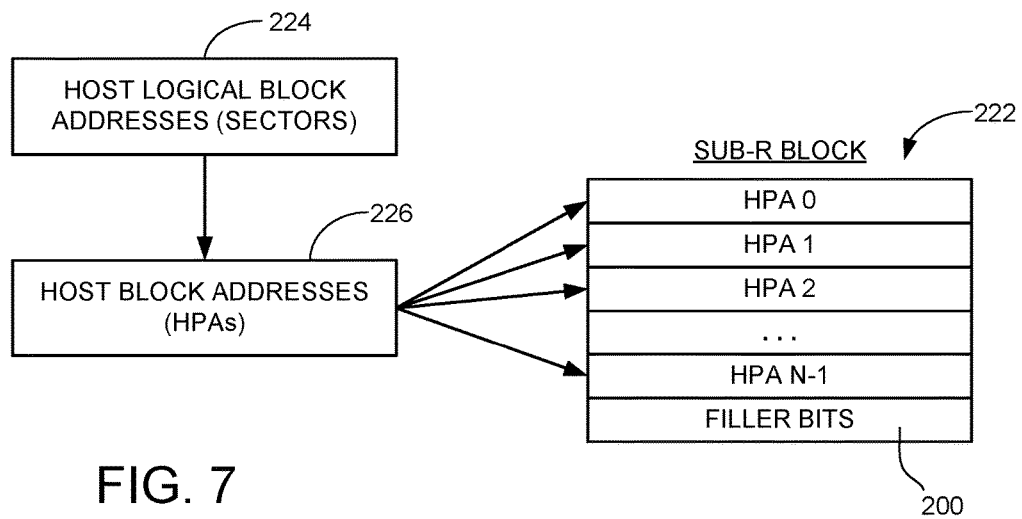
FIG. 7 is a block sequence to illustrate an exemplary manner in which input write data are arranged into host block addresses (HPAs) and Sub-R Blocks in some embodiments.

A Sub-R Block 222 is depicted in FIG. 7. Each Sub-R Block, also referred to herein as an interval block, is an integer number of the erasure blocks 218 within an associated R-Block 220. Stated another way, a given R-Block 220 is divided into a plural number of Sub-R Blocks 222. It is contemplated that all of the Sub-R Blocks 222 in a given R-Block 220 will be the same size (e.g., constitute the same number of erasure blocks 218), but such is not necessarily required.

As shown at 224 in FIG. 7, host data are received in a selected form using a host level addressing scheme that is independent of the storage media of the device 200. One common example is in the form of fixed sized logical block addresses, LBAs (e.g., sectors). Other forms can be used including virtual addresses, key-block addresses, etc. In some cases, the host data LBAs will have a selected uniform size, such as 512 bytes, 4096 bytes, etc.

The host data are combined at 226 in FIG. 7 to so called host block addresses, or HPAs. Each HPA constitutes a page of data suitable for storage by the respective SLC cache memory 210 and the n-level flash array 212 of FIG. 5. As noted above, in the present example it is contemplated that each HPA will be 32 KB in length. It can be seen in this scheme that several, if not many, of the host LBAs will be combined into each HPA. The map structures 204 utilized by the SSD controller 202 (FIG. 5) maintain flash transition layer data structure to enable identification of the current location and status of a given host LBA.

As shown by FIG. 7, the HPAs from 226 are used to populate each Sub-R Block 222 in turn, from HPA 0 to HPA N–1. As required, filler bits 228 may be appended at the end of each Sub-R Block 222 to achieve a desired size. This can be used such as when the host data are compressed. Other data may be incorporated into each Sub-R Block as well, such as header and/or footer control data, ECC data, etc., but such have been omitted for clarity of discussion.

By definition, there is an HPA boundary at the start of every R-Block (e.g., HPA 0 in FIG. 7) and the start of every R-Block is also the start of a Sub-R-Block. Likewise, by definition there is an HPA boundary at the end of every R-Block (e.g., HPA N–1 in FIG. 7) and the end of every R-Block is also the end of a Sub-R-Block.

To tile host data to the cache memory 210, a new HPA and Sub-R-Block boundary is started at the beginning of the R-Block and any number of HPAs are tiled to modulus "0" pages until the pre-defined Sub-R-Block boundary is reached. When the Sub-R-Block boundary is being approached, the SSD controller will determine the last full HPA in the Sub-R-Block and then pad the data from the end of the last HPA to the end of the flash plane (die).

To transfer (tile) the accumulated data from the cache memory 210 to the n-level flash array 214, a new HPA and Sub-R-Block boundary is started at the beginning of the R-Block for each page in the word-line. Valid pre-compressed HPAs from staggered Sub-R-Blocks are read from the cache memory and transferred to the n-level flash cells. Each page of the word-line has a unique thread of recycled Sub-R-Blocks to maintain HPA separation between the pages in the word-line. When the common word-line Sub-R-Block boundary is being approached, the SSD controller determines the last full HPA for each page in the Sub-R-Block and, as before, pads the data to the end of the flash plane (die).

When RAISE/Parity (RAISE-Redundant Array of Independent Silicon Elements) codes are being stored in the Flash array, the locations of the codes are tracked and deleted from any Sub-R-Block that contains that block. When the Firmware encounters a Parity block it should skip that block and proceed to the next block to continue recycling. By definition, RAISE/Parity is block aligned and contains no user data so it does not impact the structure of the Sub-R-Block other than it is not recyclable.

Figure 8:
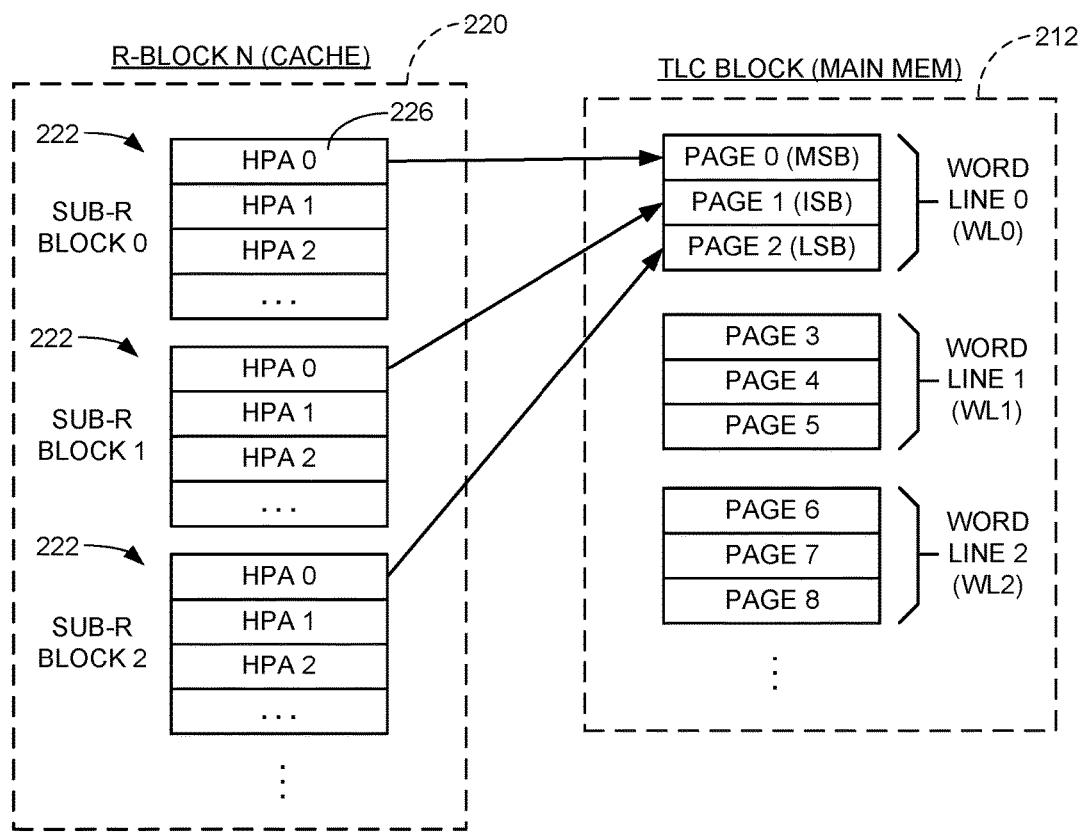
FIG. 8 is a functional representation of a transfer of accumulated data from the sub-R blocks in the cache memory to the n-level flash array of FIG. 4 in some embodiments.

These operations are generally illustrated in FIG. 8. A selected R-Block 220 of data in the cache memory 220 includes a number of Sub-R Blocks 222 including Sub-R Blocks 0-2. Each of the Sub-R Blocks 222 in turn include HPAs 226 numbered HPA 0-2. As shown by FIG. 8, different word lines 118 (see FIG. 2) of the n-level flash array 212 are denoted as WL0-WL2. The first HPA 226 in each of the Sub-R Blocks (HPA 0) is written to the first word line (WL 0). That is, the memory cells connected to WL0 are configured as TLCs to receive first, second and third pages of data. The first page of data is the HPA 0 page from Sub-R Block 0; the second page of data is the HPA 0 page from Sub-R Block 1; and the third page of data is the HPA 0 page from Sub-R block 2. Each word line in the n-level array 212 similarly receives three spaced-apart HPAs from three different Sub-R blocks.

From this it can be seen that the size of each Sub-R Block (interval block) 222 (that is, the number of HPAs) determines the logical distance between the first page and the second page of data written to a given n-level cell in the array 214.

Generally, an optimum number of Sub-R-Blocks in an R-Block is the number of die and channel threads needed to support the full sequential read performance of the host I/F. The size of the Sub-R-Block is then the total number of die divided by the number of required die and channel threads.

The basic equations to determine a suitable size of each Sub-R Block can be stated as follows:

Number of die/channel threads=Host Read Bandwidth/Flash Channel Bandwidth

Flash Channel Bandwidth=Flash Plane Size/($Tr$+ $Txfer$);

$Tr$=Flash Array Read Delay per Data Sheet Specification $Txfer$=Transfer Delay=Flash Plane Size/Flash Channel Rate $$\text{Number of Sub-}R\text{-Blocks per }R\text{-Page}=\text{Total Number of Die/Number of die/channel threads.} \qquad (4)$$

From this it can be seen that the logical distance (e.g., the number of host sectors/LBAs from the first HPA in one Sub-R Block to the first HPA in the next Sub-R Block) is generally determined in relation to the number of dies/channels and the read delay response of the n-channel array. Other factors can be utilized as well, as noted in equation (4).

FIGS. 9A and 9B have been provided to give a simplified example of the foregoing discussion. FIG. 9A shows contents of HPAs that have been stored to the SLC cache memory 210 of FIG. 5. In this simplified example, HPAs are grouped by ten (e.g., the first block HPA 0 indicates the storage of the first ten HPAs from HPA 0 to HPA 9, and so on). The data are stored in any suitable fashion in the SLC cache. To simplify processing, it is contemplated that both the cache memory 210 and the main memory 212 will share a common page size (e.g., 32 KB), although such is not necessarily required.

FIG. 9B shows corresponding aspects of the n-level flash array 212. More specifically, first and second word lines 112 (WL0 and WL1) are shown for a total of 16 dies (Die 0-F). The designation "E" indicates the particular bit positions for the cells connected to each word line are in an erased state and ready to accommodate data. All of the data in FIG. 9A will be stored on the two word lines across all 16 dies in FIG. 9B.

FIG. 10A shows the writing of the first pages of data from the cache 212 to the respective word lines in the n-level flash array 214. Each darkened block of HPAs corresponds to a different Sub-R Block. It follows that each of the Sub-R Blocks is nominally arranged on 40 HPA boundaries (e.g., the first written Sub-R Block extends from HPA 0 to HPA 39). At the conclusion of the data programming operation in FIG. 10A, each of the memory cells along the respective word lines are programmed as SLCs.

FIG. 10B shows the writing of the second pages of data from the cache 212 to the respective word lines in the array 214. As before, the data are written at the designated HPA boundaries. At the conclusion of the data programming operation in FIG. 10B, the memory cells in the array 214 are now programmed as MLCs.

FIG. 10C shows the writing of the third pages of data from the cache 212 to the respective word lines in the array 214. This programs the cells as TLCs and serves as a conclusion of the data spillover/transfer process. At this point that portion of the cache memory 210 that stored the transferred data may be garbage collected and reallocated for new user data.

FIG. 11 shows an exemplary garbage collection process to relocate the TLC data obtained from FIG. 10C. As shown, the data intervals may be maintained but a barrel shifting approach can be used as desired. For example, it will be noted that the ISB and LSB pages on WL1 have been shifted by an integral number of dies (the ISB column was shifted down 12 dies and the LSB column was shifted down 8 dies). This can enhance wear leveling and other effects.

Figure 12:
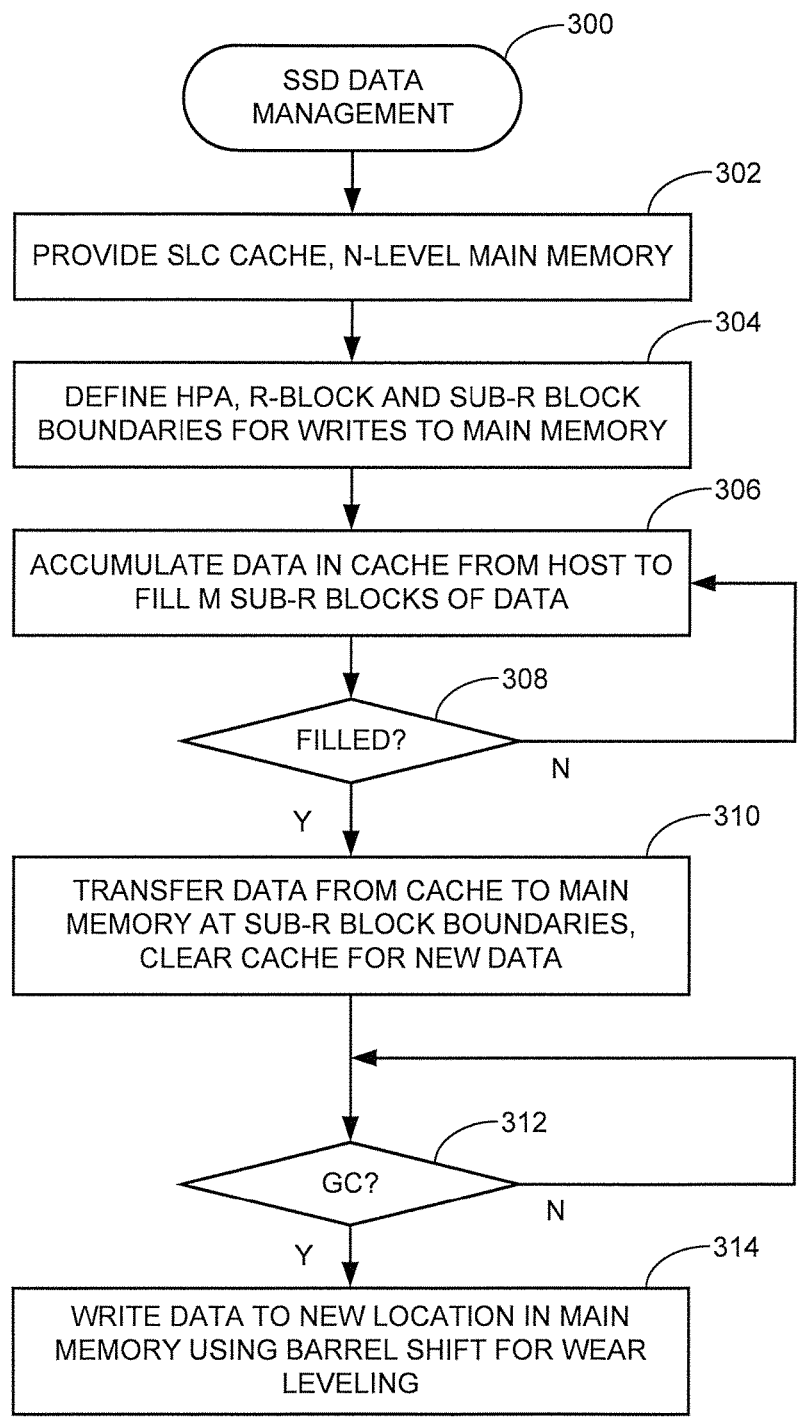
FIG. 12 is a flow chart for an SSD data management routine illustrative of steps carried out in accordance with some embodiments.

FIG. 12 provides a flow chart for an SSD data management routine 300 to summarize the foregoing discussion. It is contemplated that the routine is carried out by the SSD 200 of FIG. 5, configured with an SLC flash cache memory 210 and a TLC based NAND flash memory array 212. Other configurations can be used so this is merely exemplary and not limiting.

The cache and n-level main SSD memory are configured at step 302, followed by the definitions of various operational parameters including HPA size, R-Block size and Sub-R Block size (boundaries). As noted above, the size of the Sub-R Blocks will determine the logical separation from the first page (HPA) from one Sub-R Block to the next, which in turn will establish the logical separation between first and second pages written to a selected set of memory cells on a selected die attached to a selected word line. This interval should be sufficient to enable, at least nominally, sequential data requests to be achieved at the maximum achievable data transfer rate.

Data are thereafter accumulated in the cache memory at step 306. It is contemplated that the input host data (e.g., LBAs) will be grouped sequentially into HPAs as discussed above. The data in the HPAs may or may not be rearranged into logical order, although such can be performed as required. For example, some measure of reordering can be carried out such that LBAs 0-1000 are arranged into some corresponding set of HPAs from 0-X, although such is not required. In other embodiments, the HPAs are sequentially ordered based on receipt order of the LBAs irrespective of the LBA values.

At this point it will be noted that in write intensive environments, LBAs may be continually updated and older versions marked as stale in the cache. Version tracking can be carried out as required using existing revision mapping techniques. In some cases, a new replacement HPA may be written and an older version marked as stale to accommodate read/modify write updates. Regardless, it is contemplated that the management system utilized by the SSD controller will be sufficiently robust to identify the latest versions of the data in the cache at any given time, and can carry out the methodical transfer of the data from the cache to the TLC memory cells in the array while taking into account write updates, etc.

Decision step 308 determines whether a sufficient number of Sub-R Blocks of data have been accumulated in the cache memory. In some cases, a full R-Block worth of data will be accumulated before proceeding with the transfer. In other cases, a sufficient number of Sub-R Blocks of data will be accumulated to facilitate distribution of the data across all of the available die locations.

Once the cache is deemed to be filled, the data are transferred from the cache to the main memory at step 310 as discussed above in FIGS. 9A through 10C. It will be appreciated that description of the cache as being "filled" does not necessarily mean that no additional data can be stored to the cache, but rather, the amount of data necessary to initiate the transfer to the TLCs has been reached.

Thereafter, normal data read and write operations continue to be carried out. Requests for read data will initially be evaluated by the SLC cache (or even the volatile memory locations such as DRAM/SRAM) to achieve cache hits; otherwise read operations will be carried out and satisfied using the main memory. That portion of the cache involved in the successful transfer of the data will be recycled and made ready for the storage of new write data from the host device.

Decision step 312 determines whether a garbage collection operation should be carried out upon the main memory; if so, the TLC data may be written to a new location and barrel shifting and other suitable data rearrangement techniques may be carried out to enhance wear leveling without reducing the logical distances of the respective data to maintain optimum readback performance.

It is to be understood that even though numerous characteristics and advantages of various embodiments of the present disclosure have been set forth in the foregoing description, together with details of the structure and function of various thereof, this detailed description is illustrative only, and changes may be made in detail, especially in matters of structure and arrangements of parts within the principles of the present disclosure to the full extent indicated by the broad general meaning of the terms in which the appended claims are expressed.

What is claimed is:

1. A data storage device comprising:
    a non-volatile cache memory configured to store a sequence of pages from a host device;
    a non-volatile main memory comprising a plurality of n-level cells arranged on m separate integrated circuit dies each simultaneously accessible during programming and read operations using an associated transfer circuit, where m and n are plural numbers; and a control circuit configured to direct a writing of first and second pages from the sequence of pages to a selected set of the n-level cells coupled to a common word line on a selected integrated circuit die, the second page separated from the first page in the sequence of pages by a logical offset comprising a plurality of intervening pages in the sequence of pages, the logical offset selected responsive to the m number of integrated circuit dies and a delay time associated with the transfer circuits.

2. The data storage device of claim 1, wherein the control circuit is further configured to write a third page immediately following the first page in the sequence of pages and a fourth page immediately following the second page in the sequence of pages to a second set of the n-level cells coupled to a common word line on a second integrated circuit die.

3. The data storage device of claim 1, wherein the control circuit is further configured to arrange the sequence of pages into a corresponding sequence of interval blocks, each interval block comprising a different subset of the pages from the sequence of pages, each of the pages in each interval block having a page address, and wherein the first page is at a first page address in a first interval block and the second page is at the first page address in a different, second interval block.

4. The data storage device of claim 3, wherein each of the pages in each interval block is written to a different one of the integrated circuit die in the non-volatile main memory.

5. The data storage device of claim 1, wherein the non-volatile cache memory is a NAND flash memory comprising a plurality of single level cells (SLCs) to which the sequence of pages is written.

6. The data storage device of claim 5, wherein the non-volatile main memory is an n-level NAND flash memory with the n-level cells comprising at least a selected one of multi-level cells (MLCs), triple-level cells (TLCs) or 4× level cells (XLCs).

7. The data storage device of claim 1, further comprising a volatile buffer configured to store user data blocks of a first overall number of bits, and wherein the control circuit combines multiple ones of the user data blocks into each of the pages in the sequence of pages so that each of the pages in the sequence of pages has a second overall number of bits greater than the first overall number of bits.

8. The data storage device of claim 1, wherein the control circuit is a solid state drive (SSD) controller circuit comprising a programmable processor and associated programming stored in a memory location.

9. The data storage device of claim 1, wherein the logical offset between the first page and the second page in the sequence of pages is further selected responsive to a memory data transfer rate associated with the non-volatile main memory.

10. The data storage device of claim 1, further comprising a host interface (I/F) circuit coupled to the host device, and the logical offset between the first page and the second page in the sequence of pages is further selected responsive to a host data transfer rate associated with the host I/F.

11. A method comprising:

storing, in a non-volatile cache memory, sequentially received data blocks from a host device as a sequence of pages in a selected order, each subsequent page in the sequence of pages comprising a different plurality of the sequentially received data blocks; and transferring the sequence of pages from the non-volatile cache memory to a non-volatile main memory, comprising writing a first page and a second page from the sequence of pages to a selected set of n-level cells of the non-volatile main memory coupled to a common word line on a selected integrated circuit die of the non-volatile main memory, the second page separated from the first page in the sequence of pages by a logical offset comprising a plurality of intervening pages in the sequence of pages, the logical offset selected responsive to a total plural number m of integrated circuit dies in the non-volatile main memory and a delay time associated with a transfer circuit associated with the selected integrated circuit die.

12. The method of claim 11, wherein the transferring step further comprises writing a third page immediately following the first page in the sequence of pages and a fourth page immediately following the second page in the sequence of pages to a second set of the n-level cells coupled to a common word line on a second integrated circuit die of the m integrated circuit dies.

13. The method of claim 11, further comprising arranging the sequence of pages into a corresponding sequence of interval blocks, each interval block comprising a different subset of the pages from the sequence of pages, each of the pages in each interval block having a page address, and wherein the first page is at a first page address in a first interval block and the second page is at the first page address in a different, second interval block.

14. The method of claim 13, wherein each of the pages in each interval block is written to a different one of the integrated circuit die in the non-volatile main memory.

15. The method of claim 11, wherein the non-volatile cache memory is a NAND flash memory comprising a plurality of single level cells (SLCs) to which the sequence of pages is written.

16. The method of claim 15, wherein the non-volatile main memory is an n-level NAND flash memory with the n-level cells comprising at least a selected one of multi-level cells (MLCs), triple-level cells (TLCs) or 4× level cells (XLCs).

17. The method of claim 11, further comprising storing the data blocks from the host device in a volatile memory buffer prior to transfer of the data blocks to the non-volatile cache memory as the sequence of pages, each of the data blocks having a first overall size and each of the pages in the sequence of pages having a second overall size as a multiple of the first overall size.

18. The method of claim 17, wherein the second overall size is 32 KB.

19. The method of claim 11, wherein the logical offset between the first page and the second page in the sequence of pages is further selected responsive to a memory data transfer rate associated with the non-volatile main memory, and a host data transfer rate associated with the host device.

20. The method of claim 11, further comprising subsequently migrating the sequence of pages within the non-volatile main memory to new locations during a garbage collection operation while maintaining the logical offset between the first and second pages.

* * * * *